(12) United States Patent
Cheng et al.

(10) Patent No.: US 6,707,164 B2
(45) Date of Patent: Mar. 16, 2004

(54) PACKAGE OF SEMICONDUCTOR CHIP WITH ARRAY-TYPE BONDING PADS

(75) Inventors: Wen-Lung Cheng, Taipei (TW); Hung-Cheng Huang, Taipei (TW); I-Feng Chang, Taipei (TW)

(73) Assignee: Acer Laboratories Inc., Taipei (TW)

( * ) Notice: Subject to any disclaimer, the term of this patent is extended or adjusted under 35 U.S.C. 154(b) by 0 days.

(21) Appl. No.: 10/142,453

(22) Filed: May 10, 2002

(65) Prior Publication Data

US 2003/0075812 A1 Apr. 24, 2003

(30) Foreign Application Priority Data

Oct. 19, 2001 (TW) .......................................... 90125929

(51) Int. Cl.[7] .......................... H01L 24/48; H01L 23/50; H01L 29/40
(52) U.S. Cl. ...................... 257/786; 257/784; 257/668; 257/691; 257/203; 257/211; 257/207; 257/208
(58) Field of Search .............................. 257/784, 786, 257/668, 691, 690, 203, 211, 207, 208

(56) References Cited

U.S. PATENT DOCUMENTS

| | | | | |
|---|---|---|---|---|
| 5,691,568 A | * | 11/1997 | Chou et al. ................. | 257/691 |
| 5,841,191 A | * | 11/1998 | Chia et al. .................. | 257/691 |
| 5,962,926 A | * | 10/1999 | Torres et al. ................ | 257/786 |
| 5,982,632 A | * | 11/1999 | Mosley et al. .............. | 361/775 |
| 6,008,532 A | * | 12/1999 | Carichner ................... | 257/691 |
| 6,008,543 A | * | 12/1999 | Iwabuchi .................... | 257/778 |
| 6,020,631 A | * | 2/2000 | Mozdzen .................... | 257/691 |
| 6,037,669 A | * | 3/2000 | Shu et al. ................... | 257/786 |
| 6,137,168 A | * | 10/2000 | Kirkman ..................... | 257/691 |
| 6,291,898 B1 | * | 9/2001 | Yeh et al. ................... | 257/786 |
| 6,307,271 B1 | * | 10/2001 | Nakamura .................. | 257/786 |
| 6,320,201 B1 | * | 11/2001 | Corbett et al. ................ | 257/48 |
| 6,410,990 B2 | * | 6/2002 | Taylor et al. ................ | 257/786 |
| 6,414,386 B1 | * | 7/2002 | Beaulieu et al. ............. | 27/691 |
| 6,448,639 B1 | * | 9/2002 | Ma ............................. | 257/691 |
| 2002/0113319 A1 | * | 8/2002 | Ohno ......................... | 257/778 |

FOREIGN PATENT DOCUMENTS

JP 2000-252363 * 9/2000

* cited by examiner

Primary Examiner—Alexander Oscar Williams
(74) Attorney, Agent, or Firm—Ladas & Parry

(57) ABSTRACT

A package of a semiconductor chip with array-type bonding pads. The semiconductor chip has a plurality of bonding pads located about periphery of the chip, in which the semiconductor chip is characterized at the bonding pads being positioned in at least four rows along each side of the chip, the four rows comprising an inner row, a mid-inner row, a mid-outer row, and an outer row. The inner row and the mid-inner row of the bonding pads consist of signal pads, and the outer row and the mid-outer row of the bonding pads consist of power pads and ground pads.

18 Claims, 8 Drawing Sheets

PACKAGE OF SEMICONDUCTOR CHIP WITH ARRAY-TYPE BONDING PADS

BACKGROUND OF THE INVENTION

1. Field of the Invention

The present invention relates to a package of a semiconductor chip, and more particularly to a wire-bonding package of a semiconductor chip with bonding pads arranged in an array, such as a ball grid array structure or flip chip structure.

2. Description of the Related Art

As semiconductor technique rapidly improves, the operational speed and the complexity of the semiconductor chips have increased. Accordingly, research in packaging technology comes hereafter for the requirement of higher packaging efficiency.

In a wire-bonding package of a semiconductor chip, arrangement of bonding pads on the semiconductor chip is particularly emphasized. Conductive traces on the substrate of the package, such as a ball-grid array (BGA) package, can be lithographically defined to achieve a very fine pitch. However, the bonding pad pitch is typically restricted from achieving a comparable pitch to the conductive traces due to spacing and design rules used to account for wire bonding methods and tolerances. It goes without saying that IC bonding pad design becomes a key factor of the package manufacturing efficiency.

Generally, the structure and function of the semiconductor chip determines the number of connections to external circuit elements (which can be referred to as "input-output" or "I/O" connections). More specifically, a chip with powerful function has more I/O connections. Consequently, the IC bonding pad design is determined in functional consideration.

Conventional IC bonding pad designs include single in-line bonding pad design and staggered bonding pad design. It is desired to increase the maximum allowable pad number that can be designed on a chip with functional consideration, so single in-line bonding pad design is not preferred. Alternatively, the staggered bonding pad design relatively increases the maximum allowable pad number and has been used widely in general.

FIG. 1 and FIG. 2 show a conventional staggered BGA package 100. The package 100 has a chip 110 with a staggered bonding pad design (that is, two-tier type arrangement) disposed on the upper surface of a substrate 120. Further, the upper surface of the substrate 120 is provided with a ground ring 130, a power ring 140, and a plurality of conductive traces 160. The surface of the chip 110 is provided with a plurality of the bonding pads 122 positioned in two rows, as shown in FIG. 2. The bonding pads 122 on the chip 110 include power pads for supplying the source voltage, ground pads for supplying the ground potential, and signal pads (I/O pads). The bonding pads 122 are respectively connected to the ground ring 130, the power ring 140 and the conductive traces 160 by bonding wires 122a, 122b, 122c and 122d. Further, the chip 110, the bonding wires 122a, 122b, 122c and 122d, and a portion of the upper surface of the substrate 120 are encapsulated in a package body 150.

As shown in FIG. 2, the bonding wires 122a connect the outer-row bonding pads 122 that serve as the ground pads to the ground ring 130; the bonding wires 122b connect the outer row of the bonding pads 122 that serve as the power pads to the power ring 140; and the bonding wires 122c and 122d connect the outer row and the inner row of the bonding pads 122 that serve as the I/O pads to the conductive traces 160. In this conventional staggered BGA package 100, the bonding pads 122 include more I/O pads, so the ground pads and the power pads, which are connected to the ground ring 130 and the power ring 140 near the chip 110, are disposed as the outer row of the bonding pads 122. Further, at least four tiers of bonding wires with different loop heights are required to avoid short circuiting. That is, the bonding wires 122a and 122b have lower loop height than the bonding wires 122c, and the bonding wires 122c have lower loop height than the bonding wires 122d.

However, the maximum allowable pad number that can be designed on the chip of the conventional staggered BGA package 110 is not preferable with the functional consideration. As a result, a conventional three-tier type BGA package is disclosed to further increase the maximum allowable pad number.

FIG. 3 and FIG. 4 show a conventional three-tier type BGA package 200. The package 200 has a chip 210 with a three-tier bonding pad design (that is, three-tier type arrangement) disposed on the upper surface of a substrate 220. Further, the upper surface of the substrate 220 is provided with a ground ring 230, a power ring 240, and a plurality of conductive traces 260. The surface of the chip 210 is provided with a plurality of the bonding pads 222 positioned in three rows, as shown in FIG. 4. The bonding pads 222 on the chip 110 include power pads, ground pads, and I/O pads, in which the outer row of the bonding pads 222 consist of the power pads and the ground pads, and the mid row and the inner row of the bonding pads 222 consist of the I/O pads. The bonding pads 222 are respectively connected to the ground ring 230, the power ring 240 and the conductive traces 260 by three tiers of bonding wires 222a, 222b, and 222c, in which the low-tier bonding wires 222a connect the outer row of the bonding pads 222 to the ground ring 230 or the power ring 240, and the mid-tier bonding wires 222b and the high-tier bonding wires 222c connect the mid row and the inner row of the bonding pads 222 to the conductive traces 260, as shown in FIG. 3. Further, the chip 210, the bonding wires 222a, 222b, and 222c, and a portion of the upper surface of the substrate 220 are encapsulated in a package body 250.

The conventional three-tier type BGA package 200 further increases the maximum allowable pad number that can be designed on the chip. However, the outer row of the bonding pads 222 include only the power pads and the ground pads, so the number of the power pads and the ground pads is still limited to the number of a row. Further, the bonding wires 222a, which connect the power pads or the ground pads to the power ring 240 or the ground ring 230, are disposed to be adjacent, so the inductance effect of the bonding wires leads to noise interference and causes damage to quality of signal transmission.

SUMMARY OF THE INVENTION

In view of this, the present invention relates to a package of a semiconductor chip with array-type bonding pads, which further increases the maximum allowable pad number that can be designed on the chip. That is, the chip size can be reduced with the same number of bonding pads provided on the chip, so as to reduce cost and increase package quality of the chip.

Further, the present invention relates to a package of a semiconductor chip with array-type bonding pads, in which the bonding pads has an arrangement that the bonding wires have lower inductance effect that leads to reduced noise interference.

The present invention discloses a package, which has a substrate having an upper surface, in which the upper surface of the substrate being provided with a ground ring, a power ring and a plurality of conductive traces; and a semiconductor chip disposed on the upper surface of the substrate, in which the chip has a plurality of bonding pads located about periphery of the chip, the bonding pads are positioned in at least four rows along each side of the chip, and the four rows include an inner row, a mid-inner row, a mid-outer row, and an outer row, in which the inner row and the mid-inner row of the bonding pads consist of signal pads, and the outer row and the mid-outer row of the bonding pads consist of power pads and ground pads.

The above-mentioned package can be a flip chip structure.

Further, the package preferably has: a plurality of first bonding wires electrically connecting the outer row of the bonding pads of the chip to corresponding conductive traces of the substrate; a plurality of second bonding wires electrically connecting the mid-outer row of the bonding pads of the chip to corresponding conductive traces of the substrate; a plurality of third bonding wires electrically connecting the mid-inner row of the bonding pads of the chip to corresponding conductive traces of the substrate; a plurality of fourth bonding wires electrically connecting the inner row of the bonding pads of the chip to corresponding conductive traces of the substrate; and a package body formed over the chip, the bonding wires and the upper surface of the substrate. The package can be a ball-grid array (BGA) package.

In the above-mentioned package, it is preferable that the inner row and the mid-inner row of the bonding pads are positioned in an interlaced arrangement in relation to an edge of the chip; the mid-outer row of the bonding pads are positioned to align to the inner row of the bonding pads in a perpendicular direction to the edge of the chip; and the outer row of the bonding pads are positioned to align to the mid-inner row of the bonding pads in a perpendicular direction to the edge of the chip.

Further, the bonding pads preferably have a plurality of pad groups, each of the pad groups has an inner pad of the inner row, a mid-inner pad of the mid-inner row, a mid-outer pad of the mid-outer row, and an outer pad of the outer row of the bonding pads, in which the mid-outer pad aligns to the inner pad, and the outer pad aligns to the mid-inner pad. Further, each of the pad groups preferably has a width equal to two bonding pad pitches.

The present invention further discloses a semiconductor chip, comprising a plurality of bonding pads located about periphery of the chip, wherein the semiconductor chip is characterized at: the bonding pads being positioned in at least four rows along each side of the chip, the four rows comprising an inner row, a mid-inner row, a mid-outer row, and an outer row, wherein the inner row and the mid-inner row of the bonding pads consist of signal pads, and the outer row and the mid-outer row of the bonding pads consist of power pads and ground pads.

In the above-mentioned semiconductor chip, it is preferable that the inner row and the mid-inner row of the bonding pads are positioned in an interlaced arrangement in relation to an edge of the chip; the mid-outer row of the bonding pads are positioned to align to the inner row of the bonding pads in a perpendicular direction to the edge of the chip; and the outer row of the bonding pads are positioned to align to the mid-inner row of the bonding pads in a perpendicular direction to the edge of the chip.

Further, the bonding pads preferably have a plurality of pad groups, each of the pad groups has an inner pad of the inner row, a mid-inner pad of the mid-inner row, a mid-outer pad of the mid-outer row, and an outer pad of the outer row of the bonding pads, in which the mid-outer pad aligns to the inner pad, and the outer pad aligns to the mid-inner pad. Further, each of the pad groups preferably has a width equal to two bonding pad pitches.

Further, the above-mentioned semiconductor chip is suited to a flip chip structure or a BGA package.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

An embodiment of the semiconductor chip 10 of the present invention is hereinafter described with reference to FIG. 5.

In the embodiment, a plurality of bonding pads 20 is located about periphery of the chip 10. The present invention is characterized at the bonding pad design, in which the bonding pads 20 are positioned in at least four rows (four rows exactly in the embodiment) along each side of the chip 10. The four rows of the bonding pads 20 have an inner row 24, a mid-inner row 23, a mid-outer row 22, and an outer row 21. Further, the inner row 24 and the mid-inner row 23 of the bonding pads 20 serve as signal pads only, and the outer row 21 and the mid-outer row 22 of the bonding pads 20 serve as power pads and ground pads only.

The bonding pad arrangement in FIG. 5 can be more specifically described with reference to FIG. 6.

Figure 1:
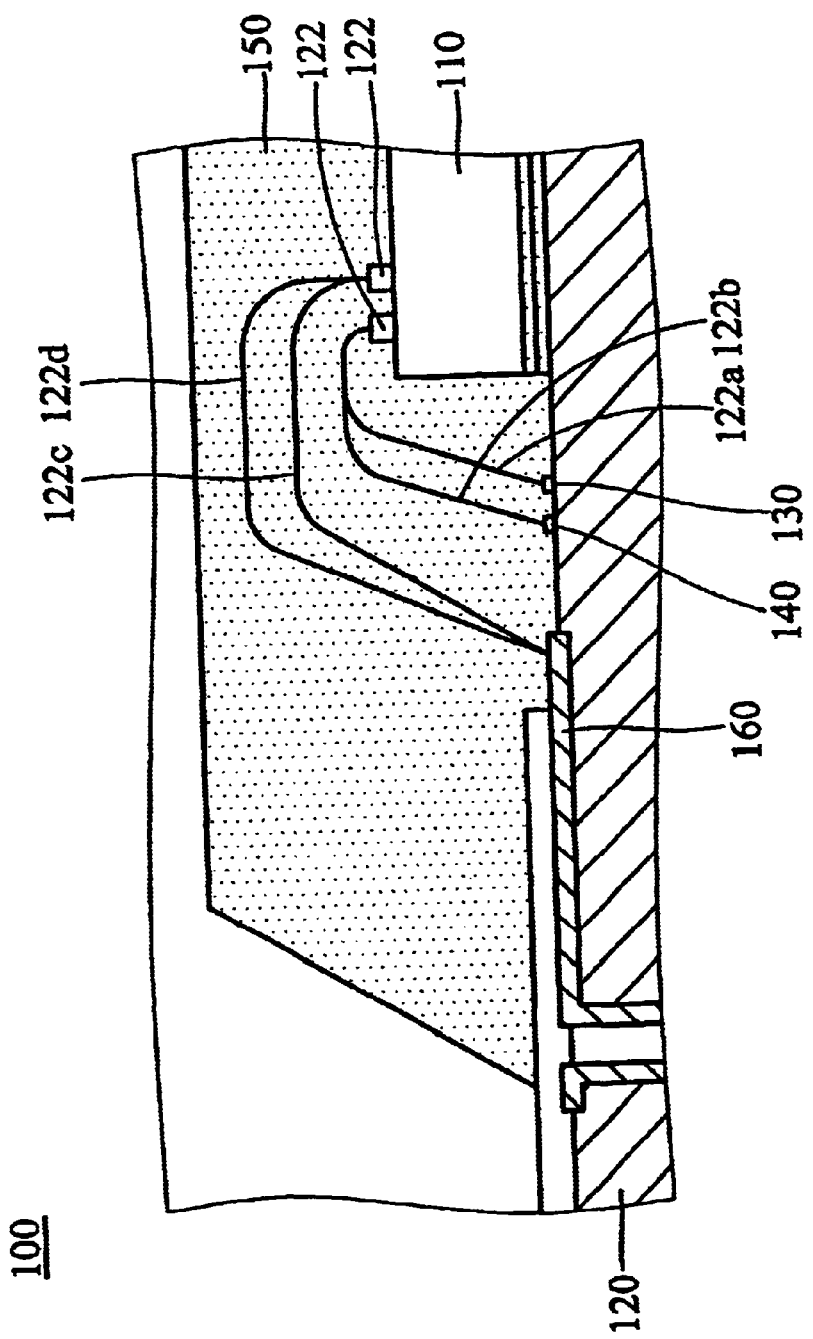
FIG. 1 is a cross sectional view of the conventional BGA package with the staggered bonding pad.
Figure 2:
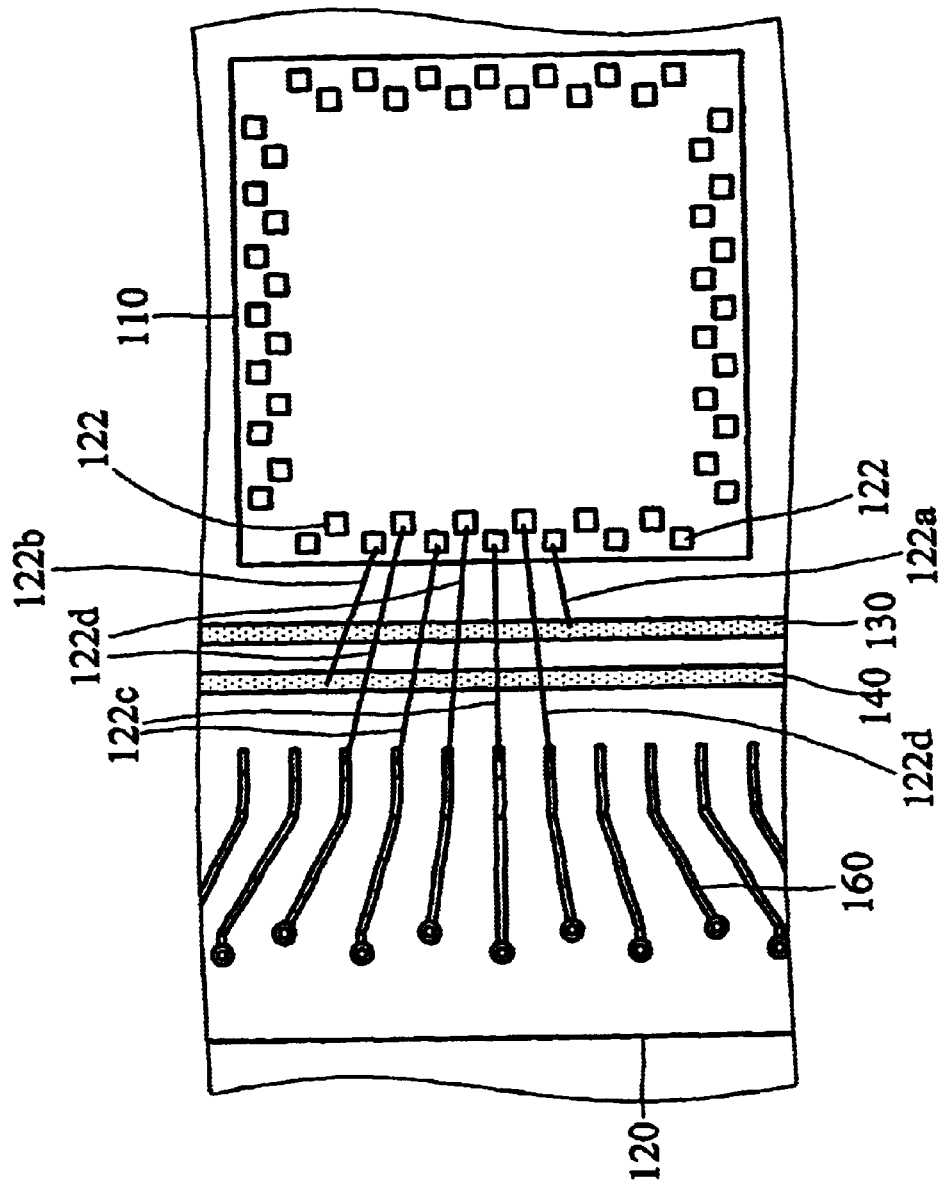
FIG. 2 is a top view of the package shown in FIG. 1, wherein the package body has been removed.
Figure 3:
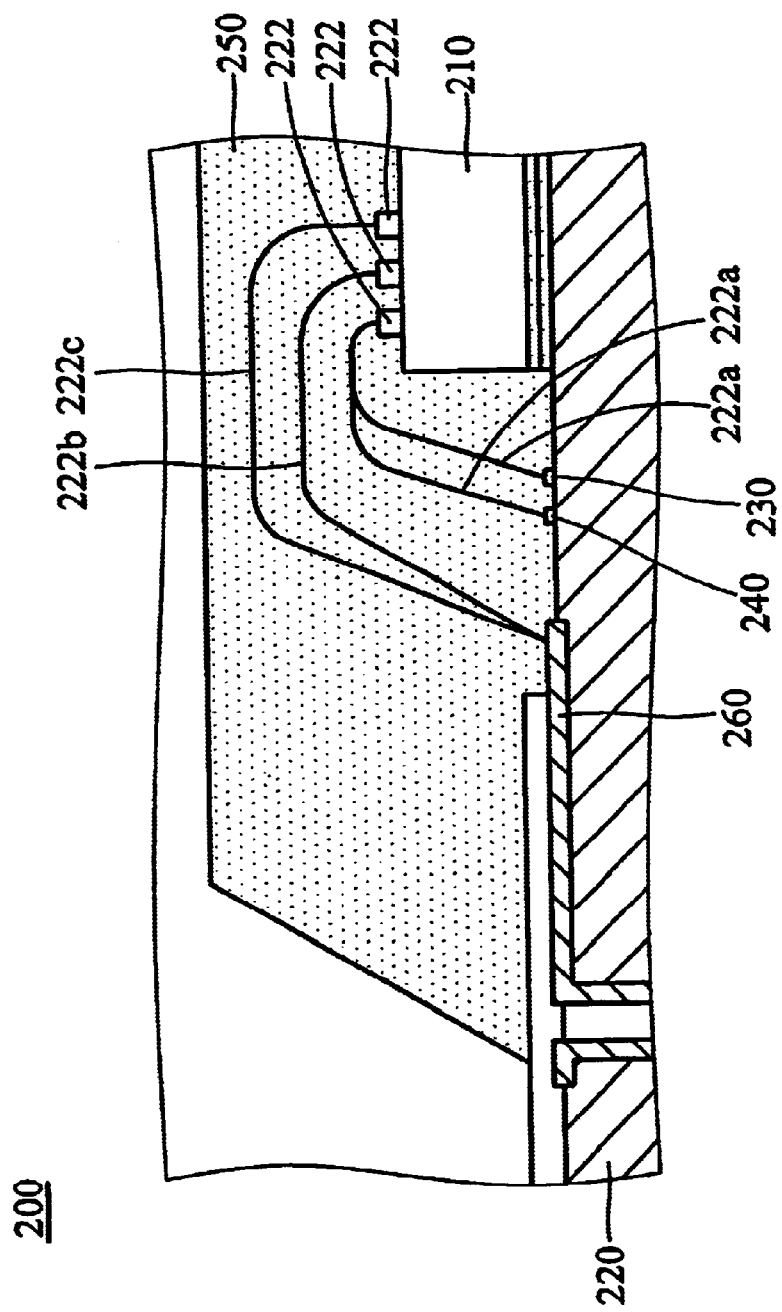
FIG. 3 is a cross sectional view of the conventional BGA package with the three-tier type bonding pad.
Figure 4:
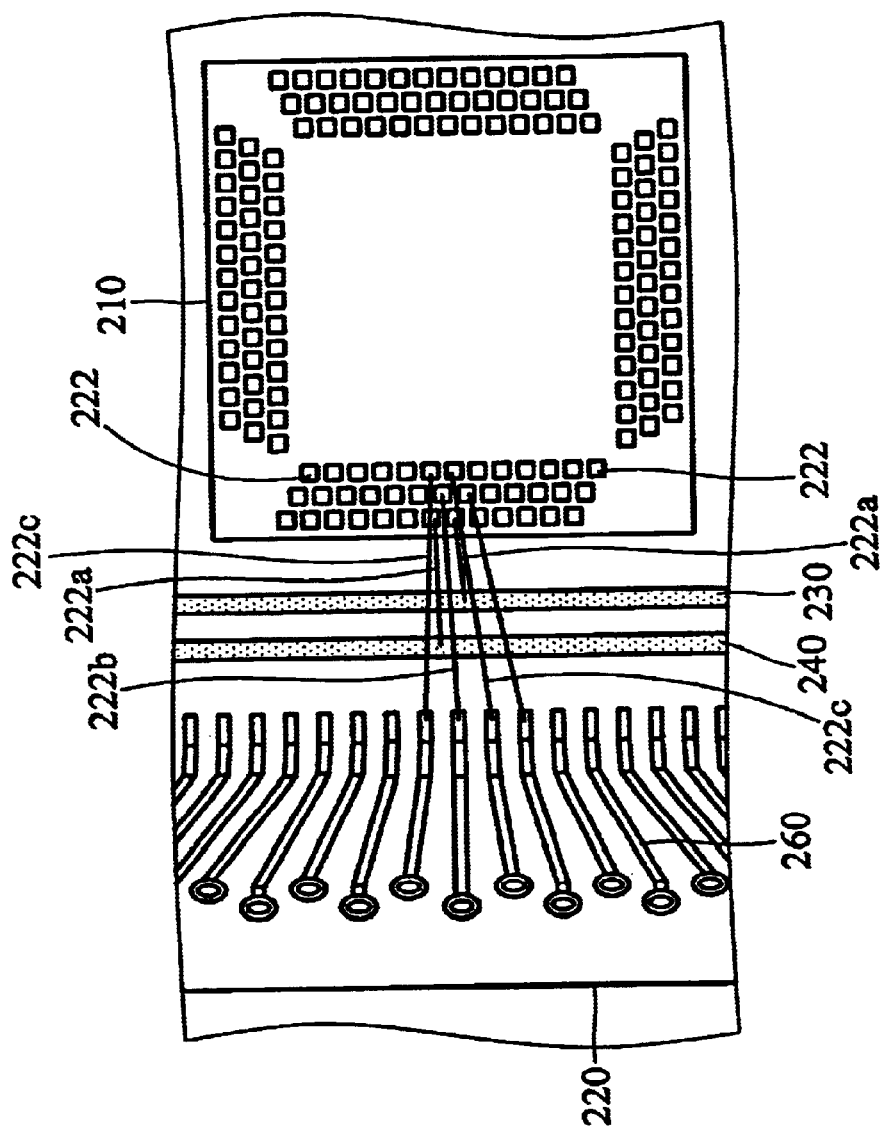
FIG. 4 is a top view of the package shown in FIG. 3, wherein the package body has been removed.
Figure 5:
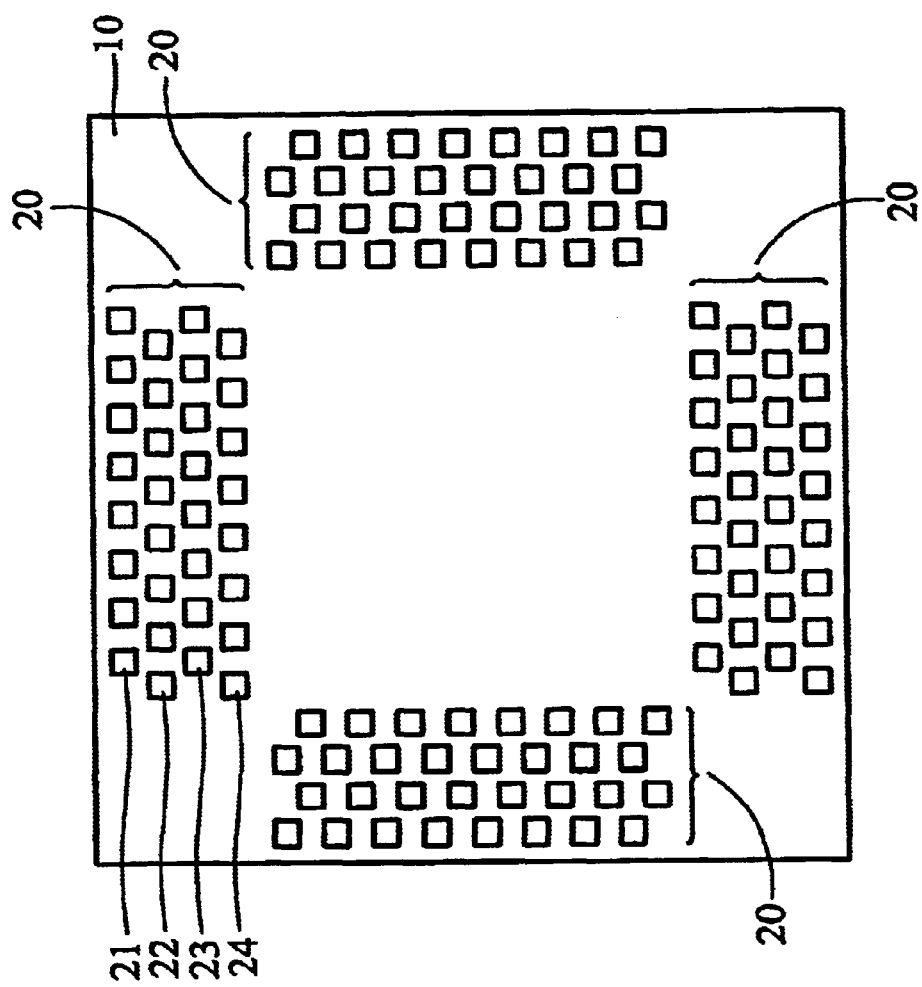
FIG. 5 is a top view showing an embodiment of the chip with bonding pads arranged in an array of the present invention.
Figure 6:
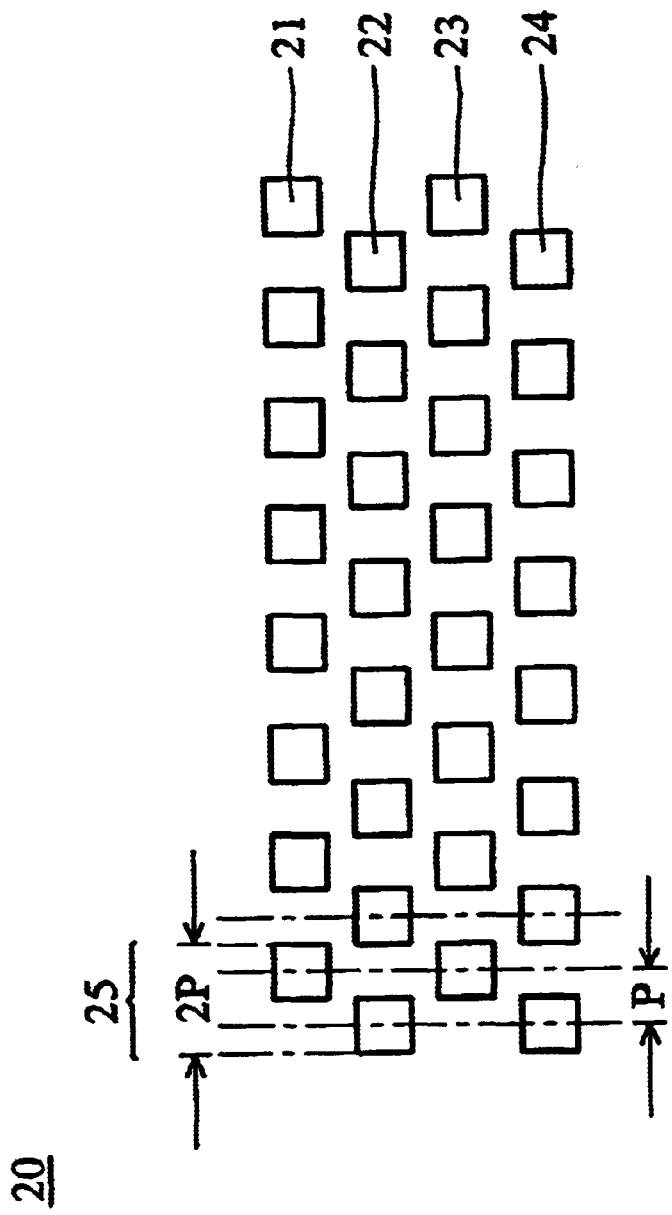
FIG. 6 is a schematic view of arrangement of the bonding pads shown in FIG. 5.

In FIG. 6, the inner row 24 and the mid-inner row 23 of the bonding pads 20 (that is, the signal pads) are disposed in an arrangement similar to the conventional staggered bonding pad design; that is, the inner row 24 and the mid-inner row 23 of the bonding pads 20 are positioned in an interlaced arrangement in relation to an edge (as shown in FIG. 5) of the chip 10. Meanwhile, the mid-outer row 22 of the bonding pads 20 are positioned to align to the inner row 24 of the bonding pads 20 in a perpendicular direction to the edge of the chip 10, and the outer row 21 of the bonding pads 20 are positioned to align to the mid-inner row 23 of the bonding pads 20 in a perpendicular direction to the edge of the chip 10. More specifically, the mid-outer row 22 and the outer row 21 of the bonding pads 20 (that is, the ground pads and the power pads) are also positioned in an interlaced arrangement in relation to the edge of the chip 10.

It should be noted that a bonding pad pitch P exists between two adjacent bonding pads 20. Further, a pad group 25 is formed with an inner pad of the inner row 24, a mid-inner pad of the mid-inner row 23, a mid-outer pad of the mid-outer row 22, and an outer pad of the outer row 21 of the bonding pads 20, in which the mid-outer pad aligns to the inner pad, and the outer pad aligns to the mid-inner pad. Thus, each of the pad groups 25 has a width 2P as shown in FIG. 6, which is equal to two bonding pad pitches P.

Further, an embodiment of the package 1 of semiconductor chip with array-type bonding pads of the present invention is hereinafter described with reference to FIG. 7 and FIG. 8.

The package 1 of the embodiment has a substrate 12, in which a ground ring 30, a power ring 40, a plurality of conductive traces 60 and the semiconductor chip 10 as described above are provided on the upper surface of the substrate 12. Further, the surface of the chip 10 is provided with a plurality of the bonding pads 20 positioned as aforementioned, in which the bonding pads 20 include an inner row 24, a mid-inner row 23, a mid-outer row 22 and an outer row 21.

Figure 7:
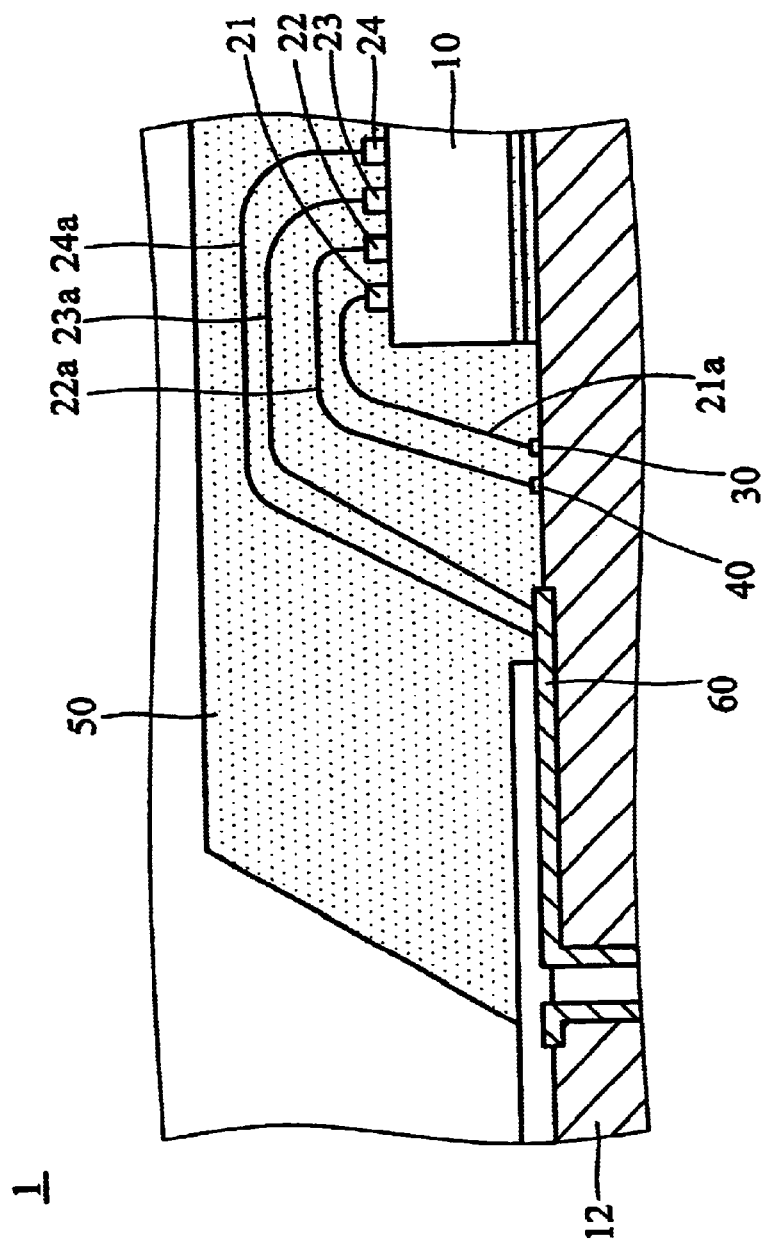
FIG. 7 is a cross-sectional view showing an embodiment of the package of the present invention.
Figure 8:
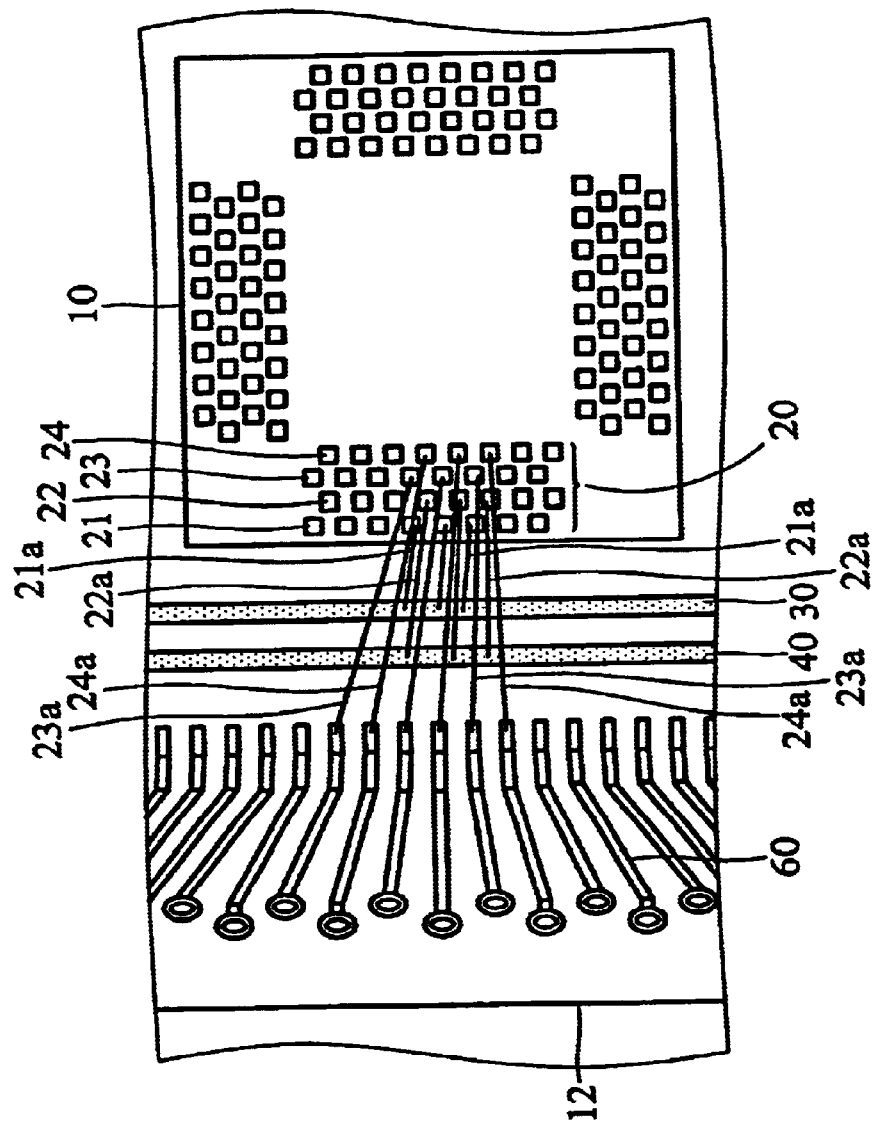
FIG. 8 is a top view of the package shown in FIG. 7, wherein the package body has been removed.

As shown in FIG. 7, a plurality of first bonding wires 21a connect the outer row 21 of the bonding pads 20 to the ground ring 30. A plurality of second bonding wires 22a, which have higher loop height than that of the first bonding wires 21a, connect the mid-outer row 22 of the bonding pads 20 to the power ring 40. Meanwhile, the mid-inner row 23 and the inner row 24 of the bonding pads 20 serve as signal pads, and a plurality of third bonding wires 23a and fourth bonding wires 24a connect the mid-inner row 23 and the inner row 24 of the bonding pads 20 to the conductive traces, in which the third bonding wires 23a have higher loop height than that of the second bonding wires 22a, and the fourth bonding wires 24a have the highest loop height among the bonding wires. Further, the chip 10, the bonding wires 21a, 22a, 23a and 24a, and a portion of the upper surface of the substrate 12 are encapsulated in a package body 150. The first, second, third and fourth bonding wires 21a, 22a, 23a and 24a have respectively different loop height to avoid short circuiting.

The present invention increases the maximum allowable pad number that can be designed on the semiconductor chip. That is, the chip size can be reduced with the same number of bonding pads provided on the chip, so as to reduce cost and increase package quality of the chip.

Further, in the present invention, the power pads and the ground pads are disposed in the outer row and the mid-outer row of the bonding pads, so the number of the power pads and the ground pads are further increased than that in the conventional three-tier type package. This leads to more bonding wires to connect the power pads and the ground pads to the power ring and the ground ring, and the inductance effect is reduced. That is, the present invention provides a package of semiconductor chip with better quality of signal transmission.

It should be noted that, in the embodiment, the outer row 21 of the bonding pads 20 serve as the ground pads only and are connected to the ground ring 30 by the first bonding wires 21a, and the mid-outer row 22 of the bonding pads 20 serve as the power pads only and are connected to the power ring 40 by the second bonding wires 22a. However, the present invention is not limited to the aforementioned arrangement; that is, the outer row 21 and the mid-outer row 22 of the bonding pads 20 can serve as power pads or ground pads as long as the bonding wires to connect the power pads to the power ring and the bonding wires to connect the ground pads to the ground ring can be separated to avoid short circuiting.

The semiconductor chip and the package of the present invention can be applied in a flip chip structure or a ball-grid array package, or any other similar package. Further, the bonding pads of the present invention can be provided with more than four rows to achieve the functional requirement of the semiconductor chip.

While the present invention has been described with reference to the preferred embodiments thereof, it is to be understood that the invention is not limited to the described embodiments or constructions. On the contrary, the invention is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A package, comprising:
    a substrate having an upper surface, wherein the upper surface of the substrate being provided with a ground ring, a power ring and a plurality of conductive traces; and
    a semiconductor chip disposed on the upper surface of the substrate, the chip having a plurality of bonding pads located about periphery of the chip, the bonding pads being positioned in at least four rows along each side of the chip, the four rows comprising an inner row, a mid-inner row, a mid-outer row, and an outer row, wherein the inner row and the mid-inner row of the bonding pads consist of signal pads, and the outer row and the mid-outer row of the bonding pads consist of power pads and ground pads.

2. The package according to claim 1, further comprising:
    a plurality of first bonding wires electrically connecting the outer row of the bonding pads of the chip to corresponding conductive traces of the substrate;
    a plurality of second bonding wires electrically connecting the mid-outer row of the bonding pads of the chip to corresponding conductive traces of the substrate;
    a plurality of third bonding wires electrically connecting the mid-inner row of the bonding pads of the chip to corresponding conductive traces of the substrate;
    a plurality of fourth bonding wires electrically connecting the inner row of the bonding pads of the chip to corresponding conductive traces of the substrate; and
    a package body formed over the chip, the bonding wires and the upper surface of the substrate.

3. The package according to claim 2, wherein:
    the inner row and the mid-inner row of the bonding pads are positioned in an interlaced arrangement in relation to an edge of the chip;
    the mid-outer row of the bonding pads are positioned to align to the inner row of the bonding pads in a perpendicular direction to the edge of the chip; and
    the outer row of the bonding pads are positioned to align to the mid-inner row of the bonding pads in a perpendicular direction to the edge of the chip.

4. The package according to claim 2, wherein the bonding pads comprise a plurality of pad groups, each of the pad groups comprises an inner pad of the inner row, a mid-inner pad of the mid-inner row, a mid-outer pad of the mid-outer row, and an outer pad of the outer row of the bonding pads, in which the mid-outer pad aligns to the inner pad, and the outer pad aligns to the mid-inner pad.

5. The package according to claim 4, wherein each of the pad groups has a width equal to two bonding pad pitches.

6. The package according to claim 2, wherein the package is a ball-grid array (BGA) package.

7. The package according to claim 1, wherein:

the inner row and the mid-inner row of the bonding pads are positioned in an interlaced arrangement in relation to an edge of the chip;

the mid-outer row of the bonding pads are positioned to align to the inner row of the bonding pads in a perpendicular direction to the edge of the chip; and the outer row of the bonding pads are positioned to align to the mid-inner row of the bonding pads in a perpendicular direction to the edge of the chip.

8. The package according to claim 1, wherein the bonding pads comprise a plurality of pad groups, each of the pad groups comprises an inner pad of the inner row, a mid-inner pad of the mid-inner row, a mid-outer pad of the mid-outer row, and an outer pad of the outer row of the bonding pads, in which the mid-outer pad aligns to the inner pad, and the outer pad aligns to the mid-inner pad.

9. The package according to claim 8, wherein each of the pad groups has a width equal to two bonding pad pitches.

10. The package according to claim 1, wherein the package is a flip chip structure.

11. A semiconductor chip, comprising a plurality of bonding pads located about periphery of the chip, wherein the semiconductor chip is characterized at:

the bonding pads being positioned in at least four rows along each side of the chip, the four rows comprising an inner row, a mid-inner row, a mid-outer row, and an outer row, wherein the inner row and the mid-inner row of the bonding pads consist of signal pads, and the outer row and the mid-outer row of the bonding pads consist of power pads and ground pads.

12. The semiconductor chip according to claim 11, wherein:

the inner row and the mid-inner row of the bonding pads are positioned in an interlaced arrangement in relation to an edge of the chip;

the mid-outer row of the bonding pads are positioned to align to the inner row of the bonding pads in a perpendicular direction to the edge of the chip; and the outer row of the bonding pads are positioned to align to the mid-inner row of the bonding pads in a perpendicular direction to the edge of the chip.

13. The semiconductor chip according to claim 11, wherein the bonding pads comprise a plurality of pad groups, each of the pad groups comprises an inner pad of the inner row, a mid-inner pad of the mid-inner row, a mid-outer pad of the mid-outer row, and an outer pad of the outer row of the bonding pads, in which the mid-outer pad aligns to the inner pad, and the outer pad aligns to the mid-inner pad.

14. The semiconductor chip according to claim 13, wherein each of the pad groups has a width equal to two bonding pad pitches.

15. The semiconductor chip according to claim 11, wherein the semiconductor chip is suited to a flip chip structure.

16. The semiconductor chip according to claim 11, wherein the semiconductor chip is suited to a ball-grid array (BGA) package.

17. A wire-bonding type ball-grid array package, comprising:

a substrate having an upper surface, wherein the upper surface of the substrate being provided with a ground ring, a power ring and a plurality of conductive traces; and a semiconductor chip disposed on the upper surface of the substrate, the chip having a plurality of bonding pads located about periphery of the chip, the bonding pads being positioned in at least four rows along each side of the chip, the four rows comprising an inner row, a mid-inner row, a mid-outer row, and an outer row, wherein the inner row and the mid-inner row of the bonding pads comprise signals pads, one of the outer row and the mid-outer row of the bonding pads consist of power pads, and the other of the outer row and the mid-outer row of the bonding pads consist of ground pads.

18. The semiconductor chip according to claim 11, wherein one of the outer row and the mid-outer row of the bonding pads consist of power pads, and the other of the outer row and the mid-outer row of the bonding pads consist of ground pads.

* * * * *